(12) United States Patent
Li et al.

(10) Patent No.: US 11,472,935 B2
(45) Date of Patent: Oct. 18, 2022

(54) COLORED RADIATIVE COOLER BASED ON TAMM STRUCTURE

(71) Applicant: Suzhou University, Jiangsu (CN)

(72) Inventors: Xiaofeng Li, Jiangsu (CN); Chunxiang Sheng, Jiangsu (CN); Yidan An, Jiangsu (CN); Cheng Zhang, Jiangsu (CN); Jun Du, Jiangsu (CN); Yan Ye, Jiangsu (CN); Linsen Chen, Jiangsu (CN)

(73) Assignee: SOOCHOW UNIVERSITY, Jiangsu (CN)

( * ) Notice: Subject to any disclaimer, the term of this patent is extended or adjusted under 35 U.S.C. 154(b) by 417 days.

(21) Appl. No.: 16/692,925

(22) Filed: Nov. 22, 2019

(65) Prior Publication Data
US 2020/0362126 A1   Nov. 19, 2020

(30) Foreign Application Priority Data
May 15, 2019 (CN) .......................... 201910404907.7

(51) Int. Cl.
| | | |
|---|---|---|
| C23C 14/00 | (2006.01) | |
| C08J 5/18 | (2006.01) | |
| C23C 14/30 | (2006.01) | |
| H05K 7/20 | (2006.01) | |
| F25B 23/00 | (2006.01) | |
| C23C 14/02 | (2006.01) | |
| C23C 14/06 | (2006.01) | |
| C23C 14/10 | (2006.01) | |
| C23C 14/18 | (2006.01) | |
| C23C 14/35 | (2006.01) | |

(52) U.S. Cl.
CPC ............ *C08J 5/18* (2013.01); *C23C 14/0015* (2013.01); *C23C 14/022* (2013.01); *C23C 14/024* (2013.01); *C23C 14/0635* (2013.01); *C23C 14/0652* (2013.01); *C23C 14/10* (2013.01); *C23C 14/18* (2013.01); *C23C 14/30* (2013.01); *C23C 14/35* (2013.01); *F25B 23/003* (2013.01); *H05K 7/20418* (2013.01)

(58) Field of Classification Search
CPC ..................................................... C23C 14/00
See application file for complete search history.

(56) References Cited

FOREIGN PATENT DOCUMENTS

| CN | 108219172 A | 6/2018 |
| CN | 108901188 A | 11/2018 |

*Primary Examiner* — David P Turocy
*Assistant Examiner* — Mohammad Mayy

(57) ABSTRACT

The present invention provides a colored radiative cooler based on a Tamm structure, including a substrate on which metal film and dielectric layers A to G are sequentially provided from bottom to top, where the Tamm structure is formed from the metal film and the dielectric layers A to D; a distributed Bragg reflector is formed from the dielectric layers A to D; and a selective emitter is formed from the dielectric layers E to G. Compared to the conventional radiative cooler, the colored radiative cooler not only has better cooling performance, but it has a wide applications in many aspects such as aesthetics and decoration.

1 Claim, 3 Drawing Sheets

COLORED RADIATIVE COOLER BASED ON TAMM STRUCTURE

CROSS-REFERENCE TO RELATED APPLICATIONS

This application claims the benefit of priority from Chinese Patent Application No. 201910404907.7, filed on May 15, 2019. The content of the aforementioned application, including any intervening amendments thereto, is incorporated herein by reference in its entirety.

TECHNICAL FIELD

The application relates to radiative cooling, more particularly, to a colored radiative cooler based on a Tamm structure.

BACKGROUND OF THE INVENTION

Radiative cooling has wide potential applications in energy-saving buildings, electronic/optoelectronic devices and personal thermal management fields due to the advantages of no need for external energy, environmental friendliness and energy conservation. The outer space at a temperature of about 3 K is a huge natural cooling source. Any object with a temperature greater than absolute zero can radiate energy outward. According to Wien's displacement law, the peak wavelength of blackbody radiation is about 9.6 µm when the temperature of the earth is 300 K, which is within the transparent atmospheric window (i.e., 8-13 µm). Therefore, with the transparent atmospheric window of such a waveband, the radiative cooling is to exchange heat in the form of radiation through the atmosphere to space, thereby achieving the cooling effect. An object radiates energy outward and absorbs solar radiation and atmospheric radiation, as well as some non-radiative energy (i.e., heat conduction and heat convection), so the net radiation of the object is the outward radiation minus the sum of the absorbed solar radiation, atmospheric radiation and non-radiative energy. When the net radiation is greater than zero, the object can be cooled. The emissivity is commonly used to measure the ability of an object for releasing energy outward in the form of radiation. According to Kirchhoff's law, the emissivity of an object is equal to its absorptivity in thermal equilibrium, so the radiative cooler needs to have high absorption within the atmospheric transparent window (8-13 µm) and high reflectance at the other bands (e.g., 0.3-8 and 13-24 µm).

The conventional radiative cooler has a large reflectance in the visible region, hence, it shows a white and unattractive appearance, which limits the aesthetic application of the radiative cooler such as decoration to some extent. Therefore, more and more researchers are interested in researches for the radiative cooler having both colors and cooling effects. In order to have both high-purity colors and satisfactory cooling effect, the radiative cooler needs to have concave reflection peaks at wavelengths (e.g., 435.8 nm, 546.1 nm and 700 nm) of the subtractive primary colors (e.g., cyan, magenta, and yellow) besides meeting the waveband requirement of the conventional radiative cooler. For example, L. Zhu et al. designed a radiative cooler that can maintain its color in sunlight by placing a periodic array of quartz bars on a periodic nanowire array of silicon, and the color of the radiative cooler is shown in pale pink (*Applied Physics Letters*, 2013, 103 (22), 223902). G. J. Lee et al. designed a radiative cooler that displays the subtractive primary colors (yellow, magenta and cyan) by embedding the MIM structure in the thermal emitter. Experiments have shown that the final steady-state temperature is 3.9° C. lower than the room temperature (*Advanced Optical Materials*, 2018, 6 (22), 1800707).

However, colors of these existing colored radiative coolers are complicated to control and have a large difference with the standard subtractive primary colors. Moreover, the colors are sensitive to the change of the incident angle. Different colors are formed due to different proportions of subtractive primary colors (i.e., three complementary colors), so the three complementary colors with a higher purity form more colors, contributing to a more extensive application. Therefore, a colored radiative cooler is needed, which is required to have high-purity subtractive primary colors and high-performance cooling effect, and be adjustable in color and insensitive to the incident angle. It can greatly promote the development of the colored electronic in the future.

SUMMARY OF THE INVENTION

The present invention provides a colored radiative cooler based on a Tamm structure as a technical solution to solve the technical problems in the prior art.

The present invention provides a colored radiative cooler based on the Tamm structure, comprising a substrate, where a metal film, a distributed Bragg reflector (DBR) and a selective emitter are sequentially provided on the substrate from bottom to top;

the Tamm structure is formed by the metal film and the distributed Bragg reflector; and a function of a thickness d, a Bragg wavelength $\lambda_B$ and a refractive index n of the DBR is $d=\lambda_B/4n$.

In some embodiments, the colored radiative cooler based on the Tamm structure comprises a substrate, on which the metal film and dielectric layers A to G are sequentially provided from bottom to top; the Tamm structure is formed by the metal film and the dielectric layers A to D; the distributed Bragg reflector is formed by the dielectric layers A to D; and the selective emitter is formed by dielectric layers E to G.

Preferably, a thickness of the substrate is 300-3000 µm.

Preferably, the substrate is made of $SiO_2$ glass.

Preferably, a thickness of the metal film ranges from 10 to 80 nm, and an optimal thickness of the metal film is determined by a calculated minimum color difference.

Preferably, a thickness of the dielectric layer A ranges from 20 to 50 nm; a thickness of the dielectric layer B ranges from 50 to 100 nm; a thickness of the dielectric layer C ranges from 20 to 50 nm; and a thickness of the dielectric layer D ranges from 50 to 100 nm; and optimal thicknesses of the dielectric layers A to D are determined by the calculated minimum color difference.

Preferably, the metal film is made of Ag, and the dielectric layers A to D are made of SiC, $MgF_2$, SiC and $MgF_2$, respectively; where SiC and $MgF_2$ have a small extinction coefficients in a solar band to avoid a parasitic heat generation, and an auxiliary heat radiation characteristic is shown in an transparent atmospheric window, which ensures a cooling effect of the colored radiative cooler.

Preferably, a thickness of the dielectric layer E of the selective emitter is 52 nm; a thickness of the dielectric layer F of the selective emitter is 900 nm; a thickness of the dielectric layer G of the selective emitter is 85 nm; and optimal thicknesses of the dielectric layers E, F and G are determined through genetic algorithm.

Preferably, the dielectric layers E to G of the selective emitter are made of $SiO_2$, SiN and $SiO_2$, respectively, where the selective emitter has a high transmittance in the visible region to ensure the color purity and a high emission/absorption in the atmospheric transparent window to enable the cooling effect.

The present invention further provides a method for fabricating a yellow radiative cooler based on a Tamm structure, comprising:

S1) selecting a $SiO_2$ glass substrate cleaned by an ion beam, and depositing by an electron beam evaporation, an Ag film with a thickness of 24 nm on the $SiO_2$ glass substrate;

S2) performing pre-sputtering for the Ag film for 15 minutes, depositing a SiC dielectric layer A with a thickness of 30 nm on the Ag film under room temperature using RF magnetron reactive sputtering; and performing high-temperature annealing;

S3) depositing a $MgF_2$ dielectric layer B with a thickness of 56 nm on the dielectric layer A using the electron beam evaporation, wherein a vacuum degree is $2\times10^{-4}$ Pa during the electron beam evaporation;

S4) performing per-sputtering for the dielectric layer B for 15 minutes; depositing a SiC dielectric layer C with a thickness of 30 nm on the dielectric layer B using the RF magnetron reactive sputtering under the room temperature; and performing high-temperature annealing;

S5) depositing a $MgF_2$ dielectric layer D with a thickness of 56 nm on the dielectric layer C using the electron beam evaporation, where a vacuum degree is $2\times10^{-4}$ Pa during the electron beam evaporation;

S6) performing pre-sputtering with Ar; depositing a $SiO_2$ dielectric layer E with a thickness of 52 nm on the dielectric layer D using the RF magnetron reactive sputtering, wherein Ar is a sputtering gas and $O_2$ is a reaction gas;

S7) performing pre-sputtering for 10-minute with Ar to remove impurities such as oxides on a target surface; depositing a SiN dielectric layer F with a thickness of 900 nm on the dielectric layer E using the RF magnetron reactive sputtering, where the sputtering gas and the reaction gas are high-purity Ar and high-purity $N_2$, respectively;

S8) performing pre-sputtering with Ar; depositing a $SiO_2$ dielectric layer G with a thickness of 85 nm on the dielectric film layer F using the RF magnetron reactive sputtering, where Ar is the sputtering gas, and $O_2$ is the reaction gas.

Working principles of the present invention are described as follows. The selective emitter needs to have a high radiation in the main transparent atmospheric window (8-13 μm) while ensuring that the visible light can pass through the selective emitter as much as possible to ensure the purity of the color. Moreover, the selective emitter needs to have a high reflection in other bands to reduce parasitic heat. The Tamm structure for displaying colors is formed by a distributed Bragg reflector and a metal film, and the color can be obtained by a concave reflection peak of an optical Tamm state (OTS) excited by the Tamm structure at the interface of the distributed Bragg reflector and the metal film. Different colors can be obtained by adjusting the thickness of the distributed Bragg reflector and the metal film. A minimum color difference (i.e., the designed three subtractive primary colors with a high purity) can be obtained by calculating the color difference between the standard and designed subtractive primary colors obtained by changing the thickness of the distributed Bragg reflector and the metal film, and then parameters of the Tamm structure corresponding to the minimum color difference are obtained. Based on the optical, thermal and color mechanisms of materials and structures, the introduction of the Tamm structure in the present invention allows the conventional radiative cooler to display the subtractive primary colors with a high purity, and to be insensitive to the incident angle. More importantly, the Tamm structure increases the radiance of the device, which ensures the radiation cooling effect.

The letters A to G in the dielectric layer in the present invention are only for distinguishing different dielectric layers and are not intended to specify the type of the dielectric layer. The dielectric layers A to G may be replaced with first to seventh dielectric layers. The dielectric layers A to D form a distributed Bragg reflector in the Tamm structure for displaying colors.

The present invention has the following beneficial effects.

1. Compared with the conventional radiative cooler, the colored radiative cooler of the present invention not only has better cooling performance, but also has wide applications in many aspects, such as the aesthetics and decoration.

2. The Tamm structure is used for displaying colors, which is insensitive to polarization and is able to excite the optical Tamm state without special incident angle and dispersion adjusting components, i.e., the optical Tamm state is easier to be excited, leading to a concave reflection peak. The Tamm structure is insensitive to incident angle due to the relatively wide spectrum of the Tamm structure.

3. The color is easier to be adjusted. Colors with different hues and purities can be obtained by changing the thickness of the distributed Bragg reflector and the metal film, and a simplified color difference calculation method is provided to find three colors closest to the standard subtractive primary colors. The colors have a high purity, which can be used for forming more colors, so that the application is more extensive. The cooling effect of devices is mainly relevant to the selective emitter, and the adjustment for colors has little influence on the cooling effect, so no conflict exists between the color displaying and the cooling effect of the colored radiative cooler.

REFERENCE NUMERALS

Figure 1:
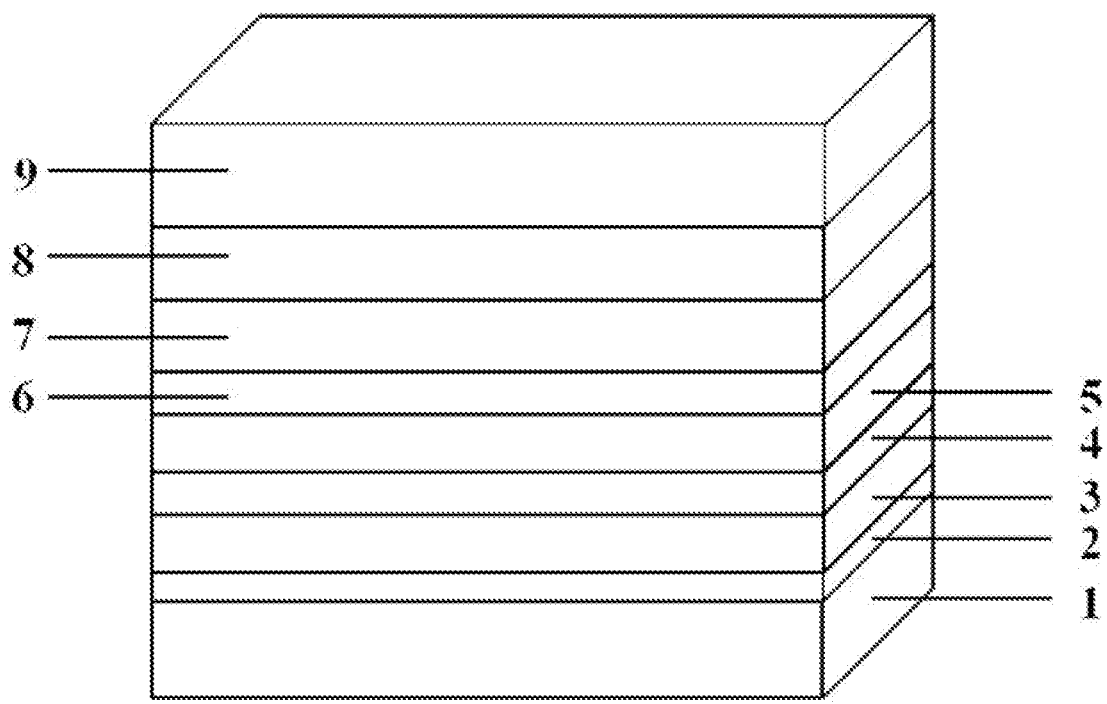
FIG. 1 is a schematic diagram of a colored radiative cooler of the present invention.

1, substrate; 2, metal film; 3, dielectric layer A; 4, dielectric layer B; 5, dielectric layer C; 6, dielectric layer D; 7, dielectric layer E; 8, dielectric layer F; 9, dielectric layer G.

DETAILED DESCRIPTION OF EMBODIMENTS

The technical solutions of the present invention will be further described in the following embodiments of the present invention, which are only a part of the embodiments of the present invention.

EXAMPLE 1

In this embodiment, illustrated is a method for fabricating a yellow radiative cooler based on a Tamm structure, comprising the following steps.

S1) A SiO$_2$ glass substrate cleaned by an ion beam is selected, on which an Ag film with a thickness of 24 nm is deposited using an electron beam evaporation.

S2) Pre-sputtering is performed for 15 minutes; a SiC dielectric layer A with a thickness of 30 nm is deposited on the Ag film using RF magnetron reactive sputtering under the room temperature; and high-temperature annealing is performed.

S3) A MgF$_2$ dielectric layer B with a thickness of 56 nm is deposited on the dielectric layer A using the electron beam evaporation, where a vacuum degree is 2×10$^{-4}$ Pa during the electron beam evaporation.

S4) Pre-sputtering is performed for 15 minutes; a SiC dielectric layer C with a thickness of 30 nm is deposited on the dielectric layer B using the RF magnetron reactive sputtering under the room temperature; and high-temperature annealing is performed;

S5) A MgF$_2$ dielectric layer D with a thickness of 56 nm is deposited on the dielectric layer C using the electron beam evaporation, where a vacuum degree of the evaporation background is 2×10$^{-4}$ Pa;

S6) Pre-sputtering with Ar is performed; a SiO$_2$ dielectric layer E with a thickness of 52 nm is deposited on the dielectric layer D using the RF magnetron reactive sputtering, where Ar is a sputtering gas, and O$_2$ is a reaction gas.

S7) Pre-sputtering is performed for 10 minutes with Ar to remove impurities such as oxides on a target surface; a SiN dielectric layer F with a thickness of 900 nm is deposited on the dielectric layer E using the RF magnetron reactive sputtering, where the sputtering gas and the reaction gas are high-purity Ar and high-purity N$_2$, respectively.

S8) Pre-sputtering with Ar is performed; a SiO$_2$ dielectric layer G with a thickness of 85 nm is deposited on the dielectric film layer F using the RF magnetron reactive sputtering, where Ar is a sputtering gas, and O$_2$ is a reaction gas.

EXAMPLE 2

In this embodiment, a method for fabricating a magenta radiative cooler based on a Tamm structure, comprising the following steps.

S1) A SiO$_2$ glass substrate cleaned by an ion beam is selected, on which an Ag film with a thickness of 22 nm is deposited using an electron beam evaporation.

S2) Pre-sputtering is performed for 15 minutes; a SiC dielectric layer A with a thickness of 38 nm is deposited on the Ag film using RF magnetron reactive sputtering under the room temperature; and high-temperature annealing is performed.

S3) A MgF$_2$ dielectric layer B with a thickness of 72 nm is deposited on the dielectric layer A using the electron beam evaporation, where the vacuum degree is 2×10$^{-4}$ Pa during the electron beam evaporation.

S4) Pre-sputtering is performed for 15 minutes; a SiC dielectric layer C with a thickness of 38 nm is deposited on the dielectric layer B using the RF magnetron reactive sputtering under the room temperature, and high-temperature annealing is performed.

S5) A MgF$_2$ dielectric layer D with a thickness of 72 nm is deposited on the dielectric layer C using the electron beam evaporation, where the vacuum degree is 2×10$^{-4}$ Pa during the electron beam evaporation.

S6) Pre-sputtering with Ar is performed; a SiO$_2$ dielectric layer E with a thickness of 52 nm is deposited on the dielectric layer D using the RF magnetron reactive sputtering, where Ar is a sputtering gas, and O$_2$ is a reaction gas.

S7) Pre-sputtering is performed for 10 minutes with Ar to remove impurities such as oxides on a target surface; a SiN dielectric layer F with a thickness of 900 nm is deposited on the dielectric layer E using the RF magnetron reactive sputtering, where the sputtering gas and the reaction gas are high-purity Ar and high-purity N$_2$, respectively.

S8) Pre-sputtering with Ar is performed; a SiO$_2$ dielectric layer G with a thickness of 85 nm is deposited on the dielectric film layer F using the RF magnetron reactive sputtering, where Ar is a sputtering gas, and O$_2$ is a reaction gas.

EXAMPLE 3

In this embodiment, illustrated is a method for fabricating a cyan radiative cooler based on a Tamm structure, comprising the following steps.

S1) A SiO$_2$ glass substrate cleaned by an ion beam is selected, on which an Ag film with a thickness of 23 nm is deposited using an electron beam evaporation;

S2) Pre-sputtering is performed for 15 minutes; a SiC dielectric layer A with a thickness of 47 nm is deposited on the Ag film using RF magnetron reactive sputtering under the room temperature; and high-temperature annealing is performed.

S3) A MgF$_2$ dielectric layer B with a thickness of 88 nm is deposited on the dielectric layer A using the electron beam evaporation, where the vacuum degree is 2×10$^{-4}$ Pa during the electron beam evaporation.

S4) Pre-sputtering is performed for 15 minutes; a SiC dielectric layer C with a thickness of 47 nm is deposited on the dielectric layer B using the RF magnetron reactive sputtering under the room temperature, and high-temperature annealing is performed.

S5) A MgF$_2$ dielectric layer D with a thickness of 88 nm is deposited on the dielectric layer C using the electron beam evaporation, where the vacuum degree is 2×10$^{-4}$ Pa during the electron beam evaporation.

S6) Pre-sputtering with Ar is performed; a SiO$_2$ dielectric layer E with a thickness of 52 nm is deposited on the dielectric layer D using the RF magnetron reactive sputtering, where Ar is a sputtering gas, and O$_2$ is a reaction gas.

S7) Pre-sputtering is performed for 10 minutes with Ar to remove impurities such as oxides on a target surface, and a SiN dielectric layer F with a thickness of 900 nm is deposited on the dielectric layer E using the RF magnetron reactive sputtering, where the sputtering gas and the reaction gas are high-purity Ar and high-purity N$_2$, respectively.

S8) Pre-sputtering with Ar is performed; a SiO$_2$ dielectric layer G with a thickness of 85 nm is deposited on the dielectric film layer F using the RF magnetron reactive sputtering, where Ar is a sputtering gas, and O$_2$ is a reaction gas.

The thickness is monitored by a quartz crystal monitor during the deposition process. The reflectance of the colored radiative cooler in the visible region and the near-infrared region is characterized by a spectrophotometer which has an unpolarized light source and a calibrated high specular reflectance standard. In the infrared region, a Fourier transform infrared spectrometer, which has an unpolarized light source and uses a reflectance of a gold film as a reflectance standard, is used to characterize the reflectance of the colored radiative cooler. A resistance temperature sensor is provided on the back of the colored radiative cooler and is connected to the data logger to measure the temperature of the colored radiative cooler. The incident solar irradiance on the surface of the colored radiative cooler is measured by a pyranometer and recorded by the data logger, where the pyranometer and the colored radiative cooler are placed on the same platform. The ambient temperature is measured by a resistance temperature sensor, the probe should be placed at the free airflow area near the sample, except for the air pockets around the sample, to carry out the measurement.

As shown in FIG. 1, the colored radiative cooler of the present invention comprises a selective emitter and a Tamm structure. The selective emitter is formed by dielectric layers E, F and G, and structural parameters thereof are obtained through genetic algorithm. The Tamm structure is formed by dielectric layers A, B, C and D and the metal film, and the structural parameters thereof are obtained by calculating the minimum color difference.

Figure 2:
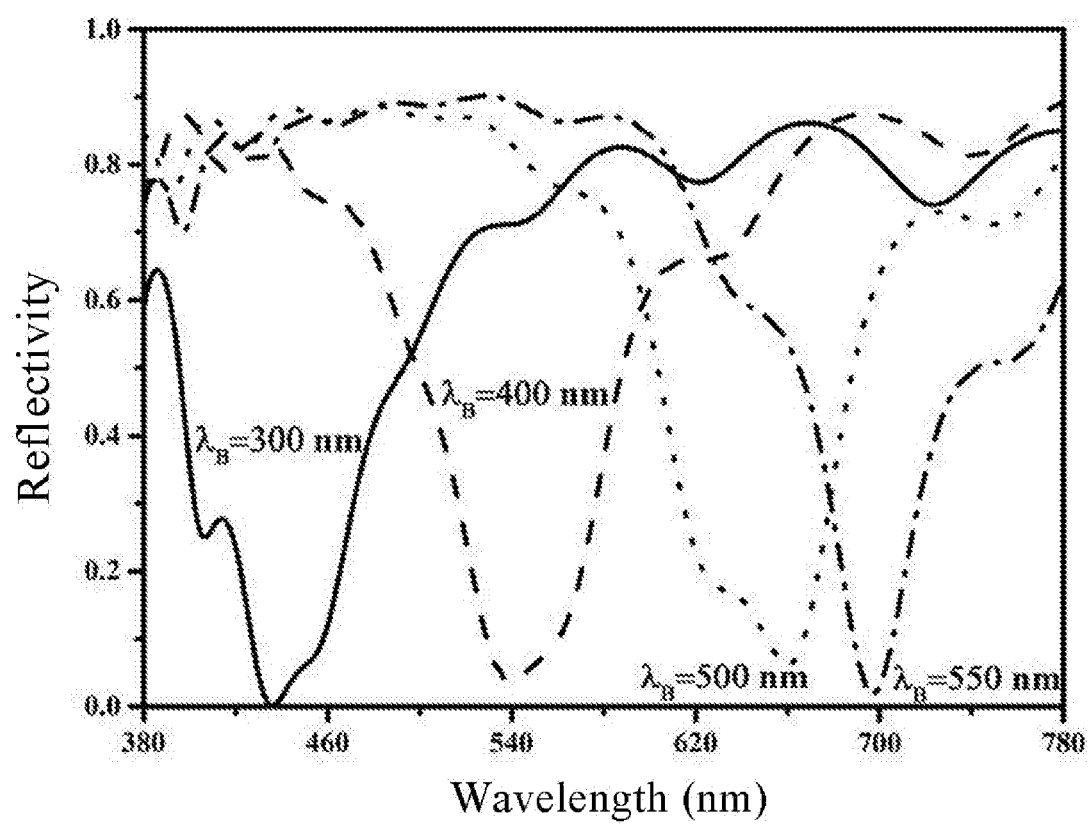
FIG. 2 is a reflectance spectrum of the colored radiative cooler of the present invention as a function of thickness (d) of the distributed Bragg reflector, where $d=\lambda_B/4n$, and $\lambda_B$ represents the Bragg wavelength and n represents the refractive index.
Figure 3:
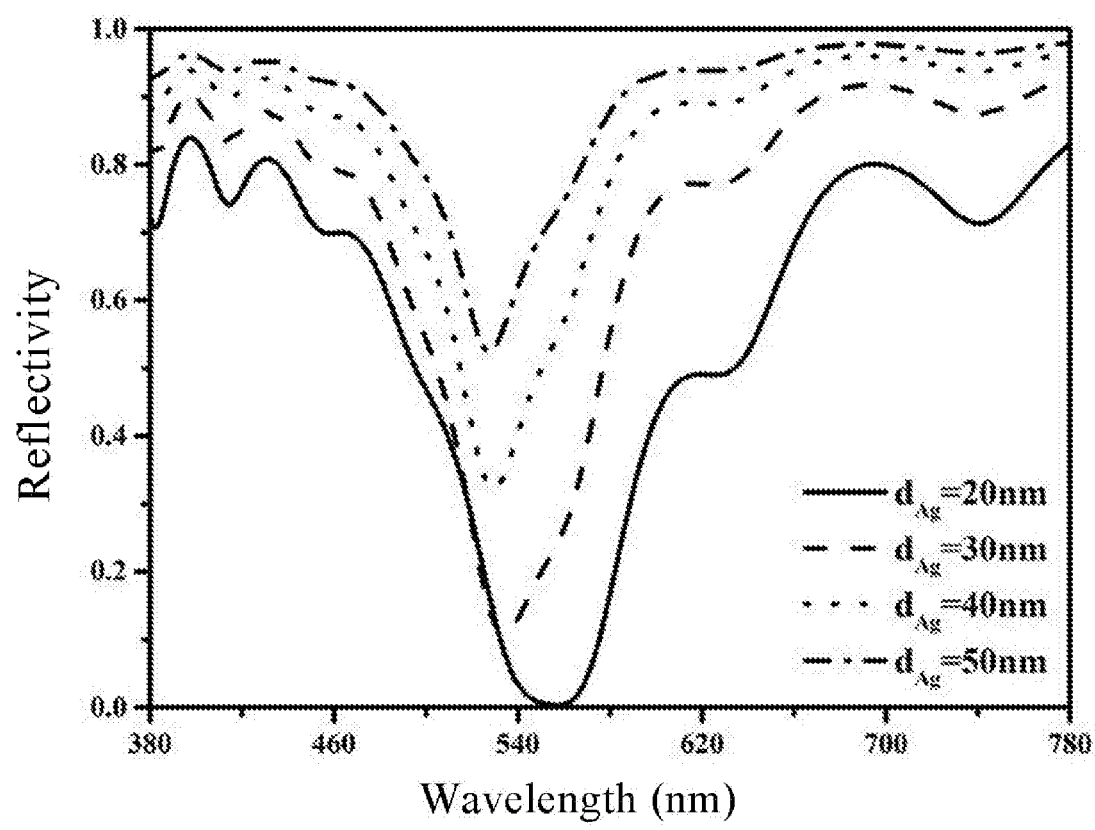
FIG. 3 is a spectrogram of the colored radiative cooler of the present invention, in which the reflectance of the colored radiative cooler is a function of thickness ($d_{Ag}$) of a metal film.

FIGS. 2 and 3 are reflectance spectrograms of the colored radiative cooler of the present invention as fucntions of a thickness d of a distributed Bragg reflector (DBR) and a thickness ($d_{Ag}$) of a metal film. As the DBR thickness increases, the peak wavelength shifts to the right, so that different color hues can be obtained by adjusting the DBR thickness. As the metal film thickness increases, the peak wavelength slightly moves, and the reflectance corresponding to the peak wavelength is reduced, which lightens the color, and thus colors with different purities can be obtained by adjusting the metal film thickness.

Therefore, a thickness of Ag is firstly determined, and the DBR thickness corresponding to the minimum color difference is determined by calculating the color difference between the standard yellow and the colors obtained by changing the DBR thickness, and then a thickness of Ag corresponding to the minimum color difference is determined by calculating the color difference between the standard yellow and the colors by changing the Ag thickness. In summary, the yellow radiative cooler after the optimization comprises a $SiO_2$ glass substrate with a thickness of 500 μm, on which an Ag film layer with a thickness of 24 nm, a SiC dielectric layer A with a thickness of 30 nm, a $MgF_2$ dielectric layer B with a thickness of 56 nm, a SiC dielectric layer C with a thickness of 30 nm, a $MgF_2$ dielectric layer D with a thickness of 56 nm, a $SiO_2$ dielectric layer E with a thickness of 52 nm, a SiN dielectric layer F with a thickness of 900 nm and a $SiO_2$ dielectric layer G with 85 nm are sequentially deposited from bottom to top. Similarly, a magenta and cyan radiative coolers can be obtained.

It should be noted that the above description is only a preferred embodiment of the present invention and is not intended to limit the scope of the present invention. Although the present invention has been described in detail with reference to the foregoing embodiments, modifications of the described technical solutions or equivalent replacement of the technical features can be made by the skilled in the art. Any modifications, equivalent substitutions, improvements, etc., made within the spirit and scope of the present invention shall fall within the scope of the present invention.

We claim:

1. A method for fabricating a yellow radiative cooler based on a Tamm structure, comprising:
    S1) selecting a $SiO_2$ glass substrate cleaned by an ion beam, and depositing, using electron beam evaporation, an Ag film with a thickness of 24 nm on the $SiO_2$ glass substrate;
    S2) performing pre-sputtering for the Ag film for 15 minutes; depositing a SiC dielectric layer A with a thickness of 30 nm on the Ag film under room temperature using RF magnetron reactive sputtering; and performing high-temperature annealing;
    S3) depositing a $MgF_2$ dielectric layer B with a thickness of 56 nm on the dielectric layer A using the electron beam evaporation, wherein a vacuum degree is $2\times10^{-4}$ Pa during the electron beam evaporation;
    S4) performing pre-sputtering for the dielectric layer B for 15 minutes; depositing a SiC dielectric layer C with a thickness of 30 nm on the dielectric layer B using the RF magnetron reactive sputtering under the room temperature; and performing high-temperature annealing;
    S5) depositing a $MgF_2$ dielectric layer D with a thickness of 56 nm on the dielectric layer C using the electron beam evaporation, wherein a vacuum degree is $2\times10^{-4}$ Pa during the electron beam evaporation;
    S6) performing pre-sputtering with Ar; depositing a $SiO_2$ dielectric layer E with a thickness of 52 nm on the dielectric layer D using the RF magnetron reactive sputtering, wherein Ar is a sputtering gas, and $O_2$ is a reaction gas;
    S7) performing pre-sputtering for 10 minutes with Ar to remove impurities on the target surface; depositing a SiN dielectric layer F with a thickness of 900 nm on the dielectric layer E using the RF magnetron reactive sputtering, wherein the sputtering gas and the reaction gas are high-purity Ar and high-purity $N_2$, respectively; and
    S8) performing pre-sputtering with Ar; depositing a $SiO_2$ dielectric layer G with a thickness of 85 nm on the dielectric film layer F using the RF magnetron reactive sputtering, wherein Ar is the sputtering gas, and $O_2$ is the reaction gas.

* * * * *